United States Patent [19]
Fujiwara

[11] Patent Number: 5,983,372
[45] Date of Patent: Nov. 9, 1999

[54] FAILURE COUNTING METHOD AND DEVICE

[75] Inventor: Teruaki Fujiwara, Tokyo, Japan

[73] Assignee: Advantest Corporation, Tokyo, Japan

[21] Appl. No.: 08/970,877

[22] Filed: Nov. 14, 1997

[30] Foreign Application Priority Data

Nov. 26, 1996 [JP] Japan ................................. 8-314795

[51] Int. Cl.$^6$ ................................................ G06F 11/00
[52] U.S. Cl. ............................................................ 714/704
[58] Field of Search ................................. 714/718, 720, 714/723, 704, 763, 42, 54

[56] References Cited

U.S. PATENT DOCUMENTS 4,958,346  9/1990  Fujisaki ................................. 371/21.3
5,841,783  11/1998  Suzuki et al. ........................... 371/5.1

*Primary Examiner*—Trinh L. Tu
*Assistant Examiner*—Samuel Kuojyn Lin
*Attorney, Agent, or Firm*—Knobbe, Martens, Olson & Bear, LLP

[57] ABSTRACT

After producing a failure bit matrix made up of a square matrix of an arbitrary degree in which failure analysis results of memory cells are written as elements at positions specified by row addresses and column addresses, the produced failure bit matrix is multiplied by its degree, the values of the origin of the matrix obtained by subjecting the degree-multiplied failure bit matrix to discrete cosine transformation are calculated, and the result is outputted as the number of failures.

4 Claims, 1 Drawing Sheet

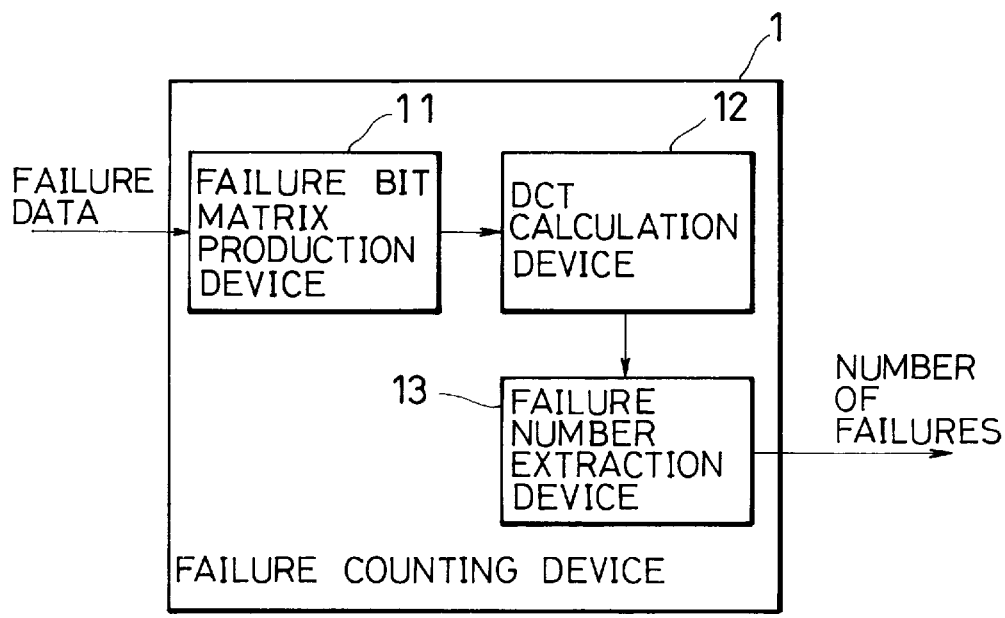
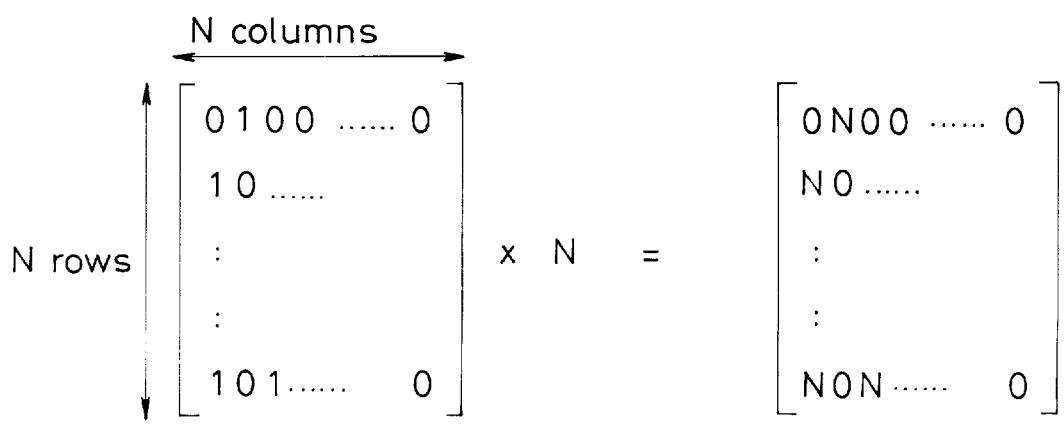

FAILURE COUNTING METHOD AND DEVICE

BACKGROUND OF THE INVENTION

1. Field of the Invention

The present invention relates to a failure counting method and device for calculating the number of defective memory cells (the number of failures) used in the failure analysis of a semiconductor memory.

2. Description of the Related Art

A semiconductor memory testing device that tests a semiconductor memory is provided with a failure analysis memory for storing failure data, which are the pass/fail determination results of each memory cell of a semiconductor memory. The failure data stored in the failure analysis memory is processed by a failure counter incorporated in the semiconductor memory testing device, the number of memory cell failures is calculated, and these results are used in judging whether an article passes or fails, or are used in a prescribed application of the semiconductor memory testing device.

In a prior-art failure counting method that seeks the number of failures of memory cells using such a failure analysis memory, a failure counter is provided with a pattern generator that generates addresses in order, the output of the pattern generator is impressed to the failure analysis memory, all addresses of the failure analysis memory are scanned, each of the stored failure data are read out, and the number of data items "1" indicating "fail" among the read failure data are counted.

In a case in which the failure analysis memory is a semiconductor memory of multi-bit structure capable of reading and writing in units of a plurality of bits, addresses are impressed for every unit of a plurality of bits, and the content of this plurality of bits is read at once in one scan.

In the above-described failure counting method of the prior art, however, the memory capacity of the failure analysis memory that employs high-cost memory such as SRAM(Static RAM) has increased along with the increase in the memory capacity of semiconductor memory, which is the object of testing, resulting in the drawbacks of prolonged processing time and increased cost of components of the semiconductor memory testing device.

To reduce the processing time, a method of finding the number of failures can be considered wherein, for example, the data storage region of the failure analysis memory is divided into a plurality of regions, whereby the failure data of these regions that are simultaneously scanned and read can be processed in parallel to find the number of failures.

However, in prior-art methods in which all addresses are scanned by a pattern generator, parallel processing is prevented because failure data for each region cannot be read simultaneously, and this inability interferes with reducing processing time.

SUMMARY OF THE INVENTION

The present invention was developed to solve the above-described problems of the prior art, and has the object of providing a failure counting method and device that can find the number of failures through parallel processing and thereby enable a reduction in processing time.

To achieve the above-described object, the failure counting method of the present invention is a method for a semiconductor memory provided with a plurality of memory cells specified by row addresses and column addresses that finds the number of failures of the memory cells from failure data, which are the failure determination results of the memory cells; wherein:

a failure bit matrix is produced that is made up of a square matrix of an arbitrary degree in which failure determination results of the memory cell are written as elements at positions specified by the row addresses and the column addresses;

the failure bit matrix is multiplied by the degree;

the value of the origin of a matrix obtained by subjecting the degree-multiplied failure bit matrix to discrete cosine transformation is calculated; and the value of the origin is outputted as the number of failures.

Alternatively, the failure counting method of the present invention is a method for in a semiconductor memory provided with a plurality of memory cells set by row addresses and column addresses that computes the number of failures of the memory cells from failure data, which are the failure determination results of the memory cells; wherein:

a plurality of failure bit matrices are produced that are made up of square matrices of arbitrary degrees in which the failure determination results of the memory cells are written at positions specified by row addresses and column addresses;

each of the failure bit matrices is multiplied by its own degree;

a value of the origin of each matrix obtained by subjecting the degree-multiplied failure bit matrices to discrete cosine transformation is calculated for each of the failure bit matrices; and values of the origins calculated for each of the failure bit matrices are added and the addition result outputted as the number of failures.

In addition, the failure counting device according to the present invention is for a semiconductor memory provided with a plurality of memory cells specified by row addresses and column addresses and calculates the number of failures of the memory cells from failure data, which are the failure determination results of the memory cells; and includes:

a failure bit matrix production device that produces a failure bit matrix made up of a square matrix of arbitrary degree in which failure determination results of the memory cells are written as elements at positions specified by row addresses and column addresses;

a DCT (discrete cosine transform) calculation device that multiplies the failure bit matrix by the degree, and calculates the value of the origin of a matrix obtained by subjecting the failure bit matrix multiplied by the degree to discrete cosine transformation; and a failure number extraction device that outputs the value of the origin as the number of failures.

Alternatively, the failure counting device according to the present invention is for a semiconductor memory provided with a plurality of memory cells specified by row addresses and column addresses and calculates the number of failures of memory cells from failure data, which are the failure determination results of the memory cells; and includes:

a failure bit matrix production device that produces a plurality of failure bit matrices that are made up of square matrices of arbitrary degrees in which the failure determination results of the memory cells are written as elements at positions specified by the row address and column addresses;

a DCT (discrete cosine transform) calculation device that multiplies each of the failure bit matrices by its own degree, and calculates the values of the origin of each matrix obtained by subjecting the degree-multiplied failure bit matrices to discrete cosine transformation for each of the failure bit matrices; and a failure number extraction device that adds the values of the origins calculated for each of the failure bit matrices and outputs the addition result as the number of failures.

In the above-described failure counting method and failure counting device, the DCT calculation device effects multiplication of the failure bit matrix by the degree, discrete cosine transformation of the degree-multiplied failure bit matrices; and calculation of the values of the origins of each of the matrices obtained by discrete cosine transformation. These origin values are taken as the number of failures.

Accordingly, the failure bit matrices are divided between a plurality of square matrices and similar processing is carried out for each of the square matrices, and as a result, the number of failures of memory cells of a semiconductor memory can be found through parallel processing.

The above and other objects, features, and advantages of the present invention will become apparent from the following description with references to the accompanying drawings which illustrate an examples of the present invention.

BRIEF DESCRIPTION OF THE DRAWINGS

FIG. 1 is a block diagram showing the construction of a failure counting device according to the present invention; and FIG. 2 is a matrix showing an example of a failure bit matrix.

DETAILED DESCRIPTION OF THE PREFERRED EMBODIMENTS

The present invention is next explained with reference to the accompanying figures.

Explanation is first presented regarding the discrete cosine transform (hereinbelow abbreviated as "DCT") used in the failure counting method of the present invention.

DCT is the same type of orthogonal transformation as the well-known fast Fourier transform (FFT), and accordingly, is one method of representing inputted signals as a plurality of frequency components.

In contrast to fast Fourier transform, which effects orthogonal transformation of a two-dimensional signal composed of x-axis and y-axis constituents, DCT is a method of effecting orthogonal transformation of a three-dimensional signal composed of x-axis, y-axis, and z-axis constituents. In addition, because DCT is a reversible transform, inverse discrete cosine transform can also be effected to reproduce the original signal without loss.

One representative example of the use of DCT can be seen in compression technology for color image signals as stipulated by JPEG (Joint Photographic Experts Group).

Equations for a DCT and inverse discrete cosine transform appear hereinbelow. These equations are for a case in which an image signal represented by an N-degree square matrix made up of a plurality of pixels (x, y) is subjected to discrete cosine transformation:

DCT can be represented as:

$$DCT(i, j) = \frac{1}{\sqrt{2N}} C(i)C(j) \sum_{x=0}^{N-1} \sum_{y=0}^{N-1} \text{pixel }(x, y) \cos\left[\frac{(2x+1)i\pi}{2N}\right] \cos\left[\frac{(2y+1)j\pi}{2N}\right]$$

$$C(x) = \frac{1}{\sqrt{2}} \quad x = 0$$
$$C(x) = 1 \quad x > 0$$

And inverse discrete cosine transform can be represented:

$$\text{pixel }(x, y) = \frac{1}{\sqrt{2N}} C(i)C(j) \sum_{i=0}^{N-1} \sum_{j=0}^{N-1} DCT(i, j) \cos\left[\frac{(2x+1)i\pi}{2N}\right] \cos\left[\frac{(2y+1)j\pi}{2N}\right]$$

$$C(x) = \frac{1}{\sqrt{2}} \quad x = 0$$
$$C(x) = 1 \quad x > 0$$

In the equations, (i, j) are positive numbers representing each element of a DCT matrix obtained by discrete cosine transformation.

Here, the element (0, 0) of DCT (i=0, j=0 is hereinbelow referred to as the "origin") represents the mean value of the signal before DCT (the direct-current component).

Each element of the DCT matrix represents the energy level of the frequency component, and the farther an element is located from the origin, the higher the energy level of its frequency component.

Explanation is next presented regarding the failure counting method of the present invention for finding the number of failures using the above-described DCT.

In the case of a semiconductor memory in which the failure analysis memory is of a multi-bit construction that allows reading and writing in units of a plurality of bits, failure data can be represented as three-dimensional data in which "0" indicating "pass" and "1" indicating "fail" are written on a two-dimensional surface specified by row addresses and column addresses, this construct being referred to as a failure bit matrix (see FIG. 2).

Failure counting device 1 shown in FIG. 1 is made up of: failure bit matrix production device 11 that produces a failure bit matrix from inputted failure data; a DCT calculation device 12 that effects DCT of a failure bit matrix and calculates the values of the origin of a DCT matrix obtained by DCT; and a failure number extraction device 13 that outputs the number of failures based on the values of the origin of the DCT matrix calculated at DCT calculation device 12.

These devises may also be constituted by a processing device such as a computer provided with a CPU and the memory necessary for computation.

In such a construction, failure bit matrix production device 11 first produces from failure data a failure bit matrix made up of an N-degree square matrix as shown in FIG. 2.

DCT calculation device 12 next multiplies the failure bit matrix produced by failure bit matrix production device 11 by the degree N (a power of the degree) as shown in FIG. 2.

Here, each element "1" in the failure bit matrix becomes "N." The N-multiplied failure bit matrix is then subjected to DCT using the above-described DCT equation, and the values of the origin of the DCT matrix are calculated (calculating by replacing each element (x, y) of the failure bit matrix with pixels (x, y) of the equation).

The calculated value of the origin of the DCT matrix is equal to the number of elements other than "0" of the failure bit matrix, i.e., the number of failures. Failure number extraction device 13 outputs the value of the origin of the DCT matrix as the number of failures.

Failure bit matrix production device 11 may also divide a failure bit matrix obtained by scanning all addresses of the memory under test into a plurality of failure bit matrices made up of square matrices of arbitrary degrees. In this case, DCT calculation device 12 multiplies each of the divided failure bit matrices by its degree N, subjects each divided failure bit matrix to DCT, and calculates the values of the origin of each DCT matrix. The number of failures of memory cells of the memory under test can then be found by adding the calculated values of the origins of each DCT matrix at failure number extraction device 13.

The processing time for counting failures can therefore be reduced because the number of failures can be found using a plurality of discrete cosine transforms that are both parallel and simultaneously processed.

Moreover, with this type of construction, the number of failures can be found directly from failure data outputted from the memory under test. Such a construction obviates the need for a failure analysis memory and thus allows a reduction in the cost of parts of a semiconductor memory testing device.

In addition, the number of failures may also be found by using a computer provided with a CPU, memory necessary for computation, and an I/O device such as a display and processing by software in lieu of using failure bit matrix production device 11, DCT calculation device 12, and failure number extraction device 13. In such a case, the number of failures can be found directly from the failure data outputted from the memory under test and the failure count results displayed on the display for immediate confirmation.

While preferred embodiments of the present invention have been described using specific terms, such description is for illustrative purposes only, and it is to be understood that changes and variations may be made without departing from the spirit or scope of the following claims.

What is claimed is:

1. A failure counting method for a semiconductor memory provided with a plurality of memory cells specified by row addresses and column addresses for finding the number of failures of said memory cells from failure data, which are failure determination results of said memory cells, comprising the steps of:

producing a failure bit matrix that is made up of a square matrix of an arbitrary degree in which failure determination results of said memory cells are written as elements at positions specified by said row addresses and said column addresses;

multiplying said failure bit matrix by said degree;

obtaining a value of the origin of a matrix by subjecting said degree-multiplied failure bit matrix to discrete cosine transformation is calculated; and outputting said value of the origin as said number of failures.

2. A failure counting method for a semiconductor memory provided with a plurality of memory cells specified by row addresses and column addresses for computing the number of failures of said memory cells from failure data, which are failure determination results of said memory cells, comprising the steps of:

producing a plurality of failure bit matrices that are made up of square matrices of arbitrary degrees in which failure determination results of said memory cells are written as elements at positions specified by said row addresses and said column addresses;

multiplying each of said failure bit matrices by its own degree;

obtaining a value of the origin of each matrix by subjecting said degree-multiplied failure bit matrices to discrete cosine transformation is calculated for each of said failure bit matrices; and outputting said values of the origin calculated for each of said failure bit matrices are added and the addition result as the number of failures.

3. A failure counting device for a semiconductor memory provided with a plurality of memory cells specified by row addresses and column addresses that calculates the number of failures of said memory cells from failure data which are the failure determination results of said memory cells, comprising:

failure bit matrix production means that produces a failure bit matrix made up of a square matrix of arbitrary degree in which failure determination results of said memory cells are written as elements at positions specified by said row addresses and said column addresses;

DCT (discrete cosine transform) calculation means that multiplies said failure bit matrix by said degree, and calculates a value of the origin of a matrix obtained by subjecting said failure bit matrix multiplied by said degree to discrete cosine transformation; and failure number extraction means that outputs the value of said origin as the number of failures.

4. A failure counting device for a semiconductor memory provided with a plurality of memory cells specified by row addresses and column addresses that calculates the number of failures of said memory cells from failure data which are the failure determination results of said memory cells, comprising:

failure bit matrix production means that produces a plurality of failure bit matrices made up of square matrices of arbitrary degrees in which failure determination results of said memory cells are written as elements at positions specified by said row addresses and said column addresses;

DCT (discrete cosine transform) calculation means that multiplies each of said failure bit matrices by its own degree, and calculates a value of the origin of each matrix obtained by subjecting said failure bit matrices multiplied by said degrees to discrete cosine transformation for each of said failure bit matrices; and failure number extraction means that adds the values of the origins calculated for each of said failure bit matrices and outputs the addition result as the number of failures.

* * * * *